United States Patent
Balakrishna et al.

(10) Patent No.: US 8,398,814 B2
(45) Date of Patent: Mar. 19, 2013

(54) TUNABLE GAS FLOW EQUALIZER

(75) Inventors: Ajit Balakrishna, Sunnyvale, CA (US); Jason Andrew Kenney, Sunnyvale, CA (US); Andrew Nguyen, San Jose, CA (US); Kenneth Collins, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 923 days.

(21) Appl. No.: 12/499,742

(22) Filed: Jul. 8, 2009

(65) Prior Publication Data

US 2011/0005680 A1    Jan. 13, 2011

(51) Int. Cl.
*H01L 21/3065* (2006.01)

(52) U.S. Cl. ............ 156/345.33; 118/715; 118/723 R

(58) Field of Classification Search ............ 118/715, 118/723 R; 156/345.33
See application file for complete search history.

(56) References Cited

U.S. PATENT DOCUMENTS

| | | | |
|---|---|---|---|
| 5,614,026 A | | 3/1997 | Williams |
| 6,261,408 B1* | | 7/2001 | Schneider et al. ........ 156/345.26 |
| 2003/0094135 A1* | | 5/2003 | Komiya et al. ............ 118/715 |
| 2004/0185584 A1* | | 9/2004 | Lin et al. ................. 438/9 |
| 2005/0224180 A1* | | 10/2005 | Bera et al. .............. 156/345.33 |
| 2007/0074741 A1* | | 4/2007 | Bease et al. ............ 134/18 |
| 2009/0218043 A1 | | 9/2009 | Balakrishna et al. |
| 2009/0250169 A1 | | 10/2009 | Carducci et al. |
| 2010/0081284 A1 | | 4/2010 | Balakrishna et al. |

FOREIGN PATENT DOCUMENTS

| JP | 10-074738 A | 3/1998 |
|---|---|---|
| KR | 10-2008-0044169 A | 5/2008 |

OTHER PUBLICATIONS

PCT International Search Report and Written Opinion for International Application No. PCT/US2010/040457 mailed Dec. 30, 2010, 8 pages.

\* cited by examiner

*Primary Examiner* — Jeffrie R Lund
*Assistant Examiner* — Satish Chandra
(74) *Attorney, Agent, or Firm* — Blakely Sokoloff Taylor & Zafman LLP

(57) ABSTRACT

A tunable gas flow equalizer is described. In an embodiment, the tunable flow equalizer includes a gas flow equalizer plate having primary opening and a secondary opening. The primary opening may surround a substrate support, and the secondary opening may be configured with a tuner. In an embodiment, the substrate support may be vertically adjustable with respect to the gas flow equalizer plate. The flow uniformity may be fine tuned by adjusting a tuner configured with a secondary opening in the gas flow equalizer plate and/or by adjusting the height of a vertically positionable substrate support plate having an inwardly tapered skirt 528 with respect to the gas flow equalizer plate 520.

20 Claims, 4 Drawing Sheets

TUNABLE GAS FLOW EQUALIZER

BACKGROUND

1. Field

Embodiments of the present invention relate to the field of semiconductor processing, and more particularly to a tunable gas flow equalizer.

2. Background Information

As semiconductor devices have increasingly reduced dimensions, process uniformity across a substrate on which the semiconductor devices is formed is paramount to maintaining high yield. Conventional process chambers utilize a single pump to exhaust process gases from a side of the process chamber. A non-uniform flow of the process gases can result in the process chamber due to the pumping of the process gases located near the exhaust port.

SUMMARY

Embodiments disclose a tunable gas flow equalizer. In an embodiment, the tunable gas flow equalizer includes a gas flow equalizer plate having primary opening and a secondary opening. In an embodiment, the primary opening surrounds a substrate support, and the secondary opening may be configured with a tuner. In an embodiment, the substrate support may have an inwardly tapered skirt and be vertically adjustable with respect to the gas flow equalizer plate. The flow uniformity across a substrate may be fine tuned by adjusting the tuner configured with the secondary opening in the gas flow equalizer plate and/or by adjusting the height of a vertically adjustable substrate support plate having an inwardly tapered skirt with respect to the gas flow equalizer plate. The tunable portion(s) can fine tune the flow uniformity according to particular processing conditions.

DETAILED DESCRIPTION

Figure 1:
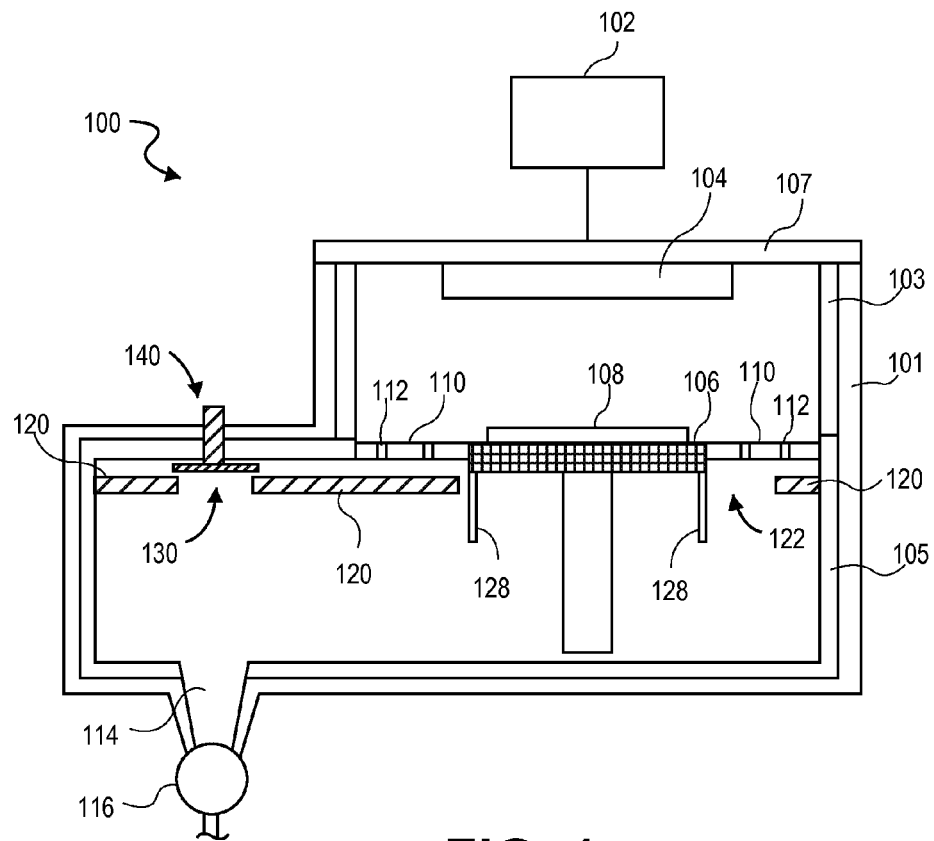
FIG. 1 is a cross-sectional side view illustration of an etching apparatus in accordance with an embodiment.

Embodiments of the present invention disclose a tunable gas flow equalizer for improving flow uniformity across a substrate in a processing chamber.

In accordance with the embodiments, flow of processing gases within a processing chamber may be tuned to facilitate more uniform flow of the gases proximate the surface of a substrate. An advantage of an ability to tune the flow of a processing gas in according an embodiment of the present invention is that of more uniformity in processing of the substrate. In addition, flow equalizer designs can be tuned for particular processing conditions (e.g. pressure, flow, species, or gap). Particular processing conditions can be changed and the tunable portion of the flow equalizer design can provide the necessary flow compensation, thus expanding the window of operation of the processing chamber. In an embodiment, a tunable flow equalizer includes a gas flow equalizer plate having primary opening and a secondary opening. The primary opening may surround a substrate support, and the secondary opening may be configured with a tuner. The primary opening may be non-annular in shape to compensate for the gross skew of gas flow uniformity across the substrate being processed. For example, the primary opening may be configured to provide uniform flow for a base process with particular processing conditions. The tunable portion is then used to fine tune the flow uniformity according to the particular processing conditions being used, and/or when the particular processing conditions are changed. In an embodiment, the tunable portion may include the secondary opening in combination with a tuner. In an embodiment, the tunable portion may include an inwardly tapered skirt surrounding a vertically positionable substrate support.

The tunable gas flow equalizer may be utilized in any suitable processing apparatus in which processing gases are pumped through an exhaust. Suitable commercially available process chambers include any of the DPS®, ENABLER®, AdvantEdge™, or other process chambers available from Applied Materials, Inc. of Santa Clara, Calif. While described below with respect to a plasma etch reactor, other forms of etch chambers may be modified in accordance with the embodiments, including reactive ion etch (RIE) chambers, electron cyclotron resonance (ECR) chambers, and the like. In addition, embodiments may be useful in any processing chamber where flow control may improve process uniformity across the surface of a substrate being processed, such as atomic layer deposition (ALD) chambers, chemical vapor deposition (CVD) chambers, plasma enhanced chemical vapor deposition (PECVD) chambers, magnetically enhanced plasma processing chambers, and the like.

Various embodiments described herein are described with reference to figures. However, certain embodiments may be practiced without one or more of these specific details, or in combination with other known methods and configurations. In the following description, numerous specific details are set forth, such as specific configurations, compositions, and processes, etc., in order to provide a thorough understanding of the embodiments of the present invention. Reference throughout this specification to "one embodiment" or "an embodiment" means that a particular feature, configuration, composition, or characteristic described in connection with the embodiment is included in at least one embodiment of the invention. Thus, the appearances of the phrase "in one embodiment" or "an embodiment" in various places throughout this specification are not necessarily referring to the same embodiment of the invention. Furthermore, the particular features, configurations, compositions, or characteristics may be combined in any suitable manner in one or more embodiments.

FIG. 1 is a cross-sectional side view illustration of an etching apparatus in accordance with an embodiment. As shown, apparatus 100 includes a chamber body 101 including an upper liner 103, a lower liner 105, and lid 107. A gas panel 102 feeds processing gases through a gas distribution plate 104 and into the chamber body 101. Chamber body 101 may optionally include an upper liner 103 and lower liner 105 lining the surface of the chamber body 101. It is understood that the illustration in FIG. 1 of liners 103 and 105 lining the entire surface of the chamber body is merely illustrative and that embodiments also contemplate more complex designs of liners 103 and 105. A substrate support 106 is provided within the chamber body to hold a substrate 108 to be processed. A plasma screen plate 110 with openings 112 is attached to substrate support 106 and the chamber body 101 (or alternatively chamber liner 105). Gas flow equalizer plate 120 is also attached to the chamber body 101 (or alternatively chamber liner 105).

Figure 2:
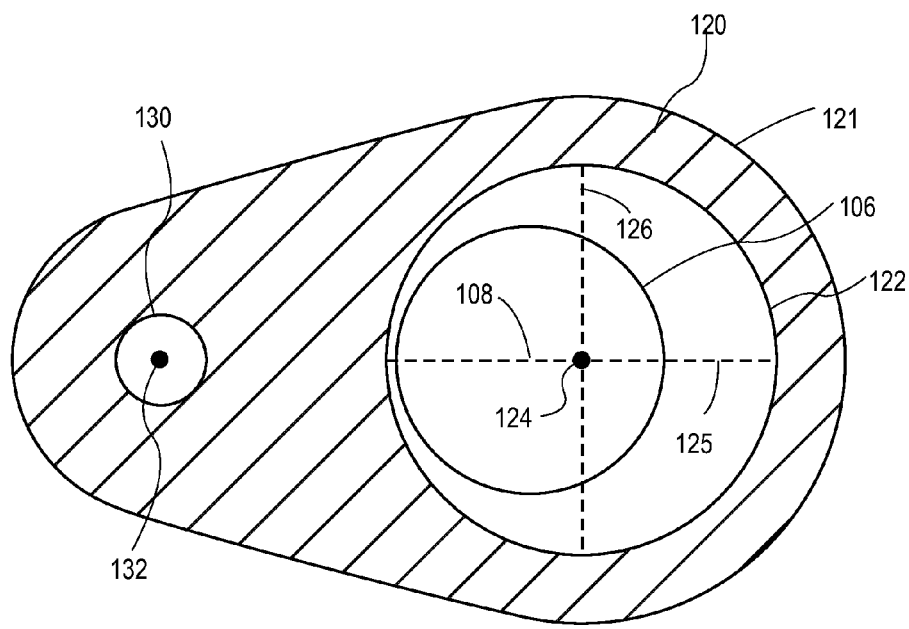
FIG. 2 is a top view illustration of a gas flow equalizer plate in accordance with an embodiment.

FIG. 2 is a top view illustration of a gas flow equalizer plate in accordance with an embodiment. As shown in FIG. 2, the gas flow equalizer plate 120 includes an outer edge 121 having a non-annular oblong shape. The outer edge 121 may be configured to be uniformly attached with the chamber wall 101 or chamber liner 105. The outer edge may have a variety of shapes including, but not limited to, annular, non-annular, oblong, asymmetric, oval, and elliptical. Gas flow equalizer plate 120 includes a primary opening 122 and a secondary opening 130. In an embodiment, the primary opening 122 is non-annular. For example, the primary opening can be oblong, asymmetric, oval, and elliptical. In an embodiment, the primary opening 122 is elliptical and includes a center point 124, major axis 125 and minor axis 126. As shown in FIG. 2, the substrate support plate 106 is positioned within the primary opening 122. In an embodiment, the support plate 106 has a center point 108 in alignment with the major axis 125 and off-center from center point 124. In an embodiment, substrate support 106 has a diameter of approximately 400 mm, the major axis 125 is approximately 19 inches, and minor axis 126 is approximately 18 inches. In an embodiment, secondary opening 130 is annular. In an embodiment, the secondary opening 130 has a diameter of 6 inches. In an embodiment, secondary opening 130 has a center point 132 in alignment with major axis 125.

Gas flow equalizer plate 120 may be formed of a variety of materials. In an embodiment, gas flow equalizer plate 120 is formed of a non-conductive material in order to avoid potential arcing with the substrate support 106. In an embodiment, gas flow equalizer plate 120 is formed of aluminum, anodized aluminum, or quartz. Gas flow equalizer plate 120 may also contain a protective coating such as a yttria or yttria containing coating. In an embodiment, gas flow equalizer plate 120 has a thickness of 2-10 mm.

Referring again to FIG. 1, a skirt 128 may be attached to and extend down from the substrate support 106 in order to protect the back side of the substrate support 106 from the process gases. In an embodiment, a tuner 140 is configured with the secondary opening 130, as described in more detail with regard to FIG. 3 and FIG. 4A-FIG. 4C. In an embodiment, the tuner 140 and secondary opening 130 are positioned directly over the exhaust port 114.

Figure 3:
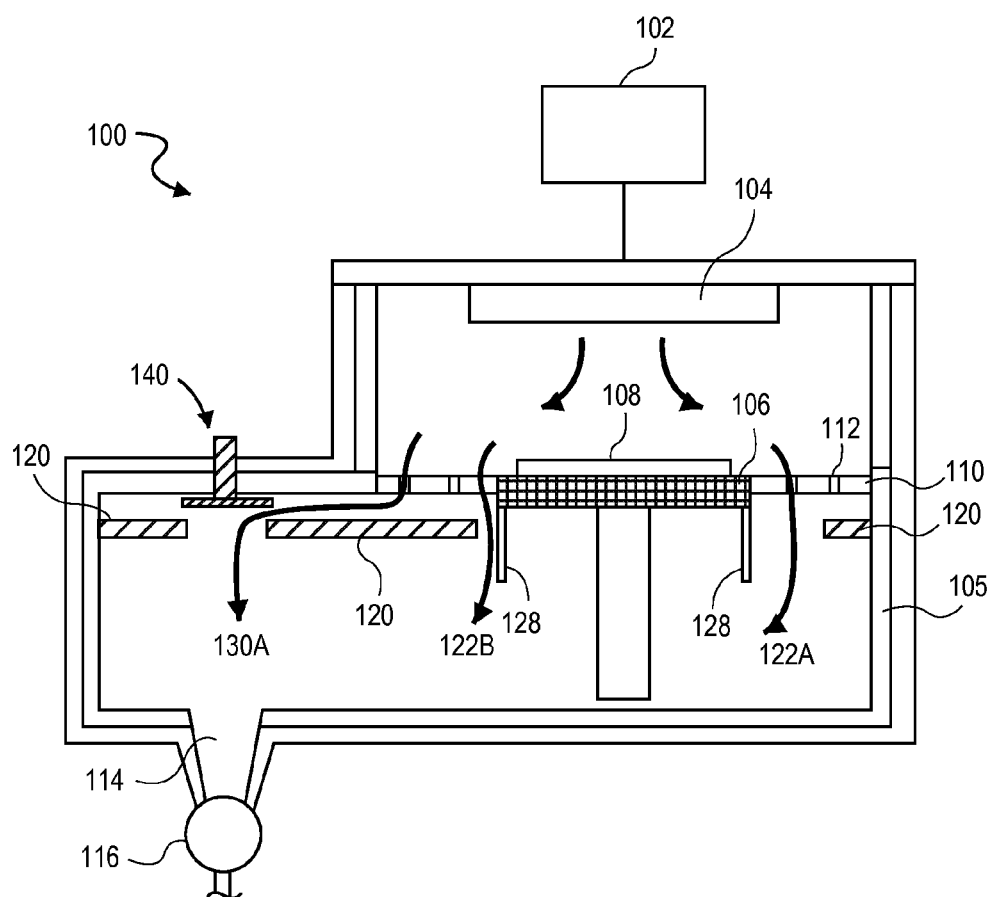
FIG. 3 is an illustration of gas flow paths in the etching apparatus of FIG. 1 in accordance with an embodiment.

FIG. 3 is an illustration of gas flow paths in the etching apparatus of FIG. 1 in accordance with an embodiment. As shown, the gas entering the apparatus through gas distribution plate 104 flows across the substrate 108, through the plasma screen plate 110, through the gas flow equalizer plate 120 and toward the exhaust port 114 and vacuum pump 116. In an embodiment, the gross skew of gas flow uniformity across the substrate 108 is determined by the horizontal axial position of the substrate support 106 within the primary opening 122 of gas flow equalizer plate 120. The primary gas flow between the edge of the substrate support 106 and the gas flow equalizer plate 120 is represented by gas flow paths 122A and 122B.

The tunable portion can further fine tune the flow uniformity across the substrate. Still referring to FIG. 3, the tuner 140 may be configured with the secondary opening 130 in the gas flow equalizer plate 120 to control the amount of gas flow through the gas bypass path 130A. In an embodiment, the tuner 140 and secondary opening 130 are positioned directly above the exhaust port 114 to more effectively control the gas bypass path 130A. In an embodiment, secondary opening 130 is concentric with the exhaust port 114.

Figure 4A:
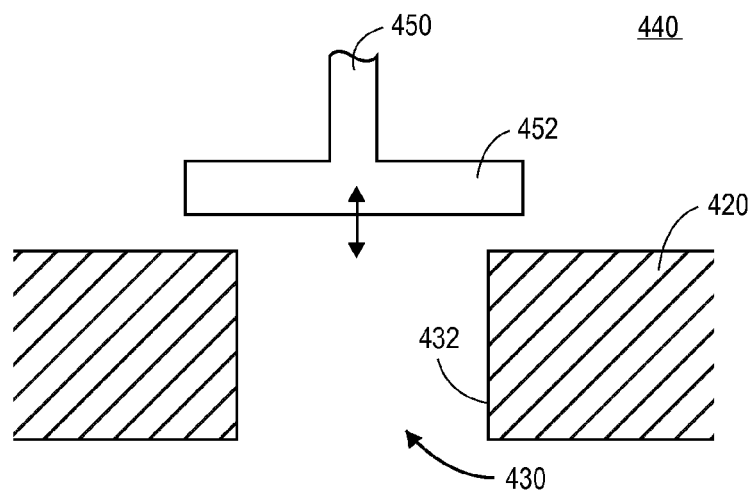
FIGS. 4A-4C are cross-sectional side view illustrations of an adjustable tuner in accordance with an embodiment.
Figure 4B:
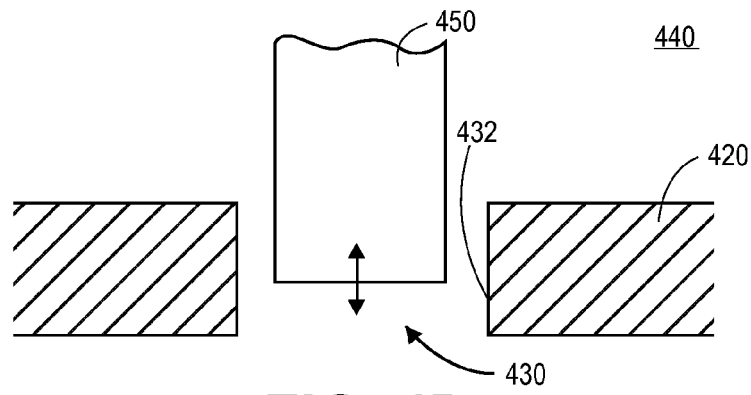
Figure 4C:
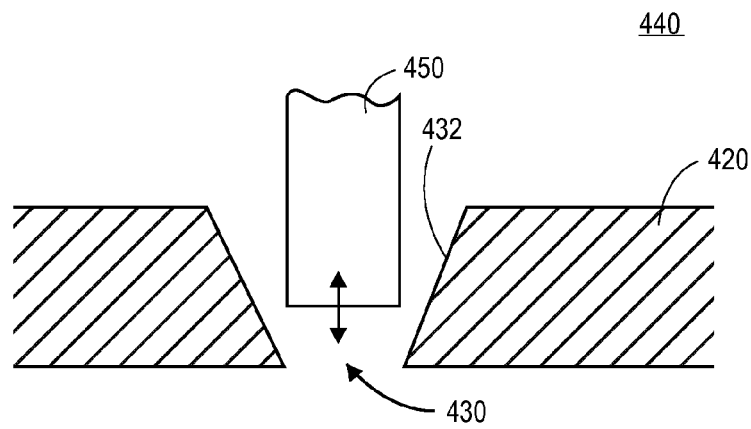

FIGS. 4A-4C are cross-sectional side view illustrations of an adjustable tuner in accordance with embodiments of the invention. In one embodiment illustrated in FIG. 4A, the adjustable tuner 440 includes an adjustable part 450 located above the secondary opening 430 of the gas flow equalizer plate 420. As shown, the adjustable part 450 can include a flat lower plate 452 having a width larger than the width of secondary opening 430. The plate 452 may be lowered to contact the top surface of the gas flow equalizer plate 420 in order to completely block the gas bypass path 130A previously described in FIG. 3. The plate 452 may be raised to increase the amount of gas flow through the gas bypass path 130A. The sidewalls of the secondary opening 430 can be straight or tapered.

An alternate plunger-type embodiment of a tuner assembly 440 is provided in FIGS. 4B-4C. As shown in FIG. 4B, the adjustable tuner 440 includes an adjustable plunger 450, and the sidewalls 432 of the secondary opening 430 are straight. The amount of gas flow through the gas bypass path 130A is controlled by the height of the adjustable plunger 450 with regard to the gas flow equalizer plate 420. An alternate embodiment is illustrated in FIG. 4C in which the sidewalls 432 are inwardly tapered. It is to be appreciated that the embodiments illustrated in FIGS. 4A-FIG. 4C are merely illustrative of various tuner assemblies, and that embodiments of the present invention are not so limited.

Figure 5A:
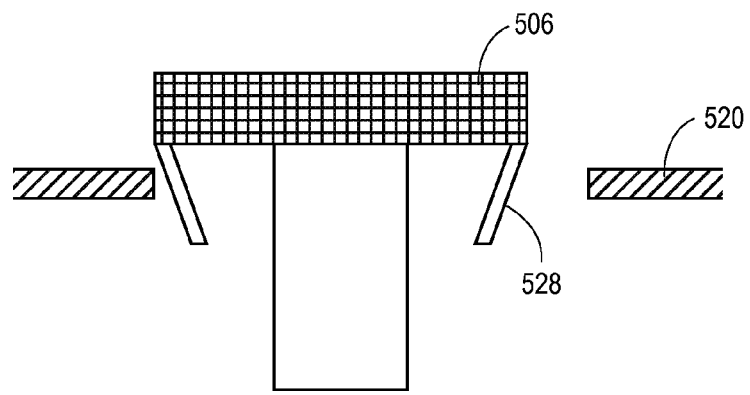
FIGS. 5A-5B are cross-sectional side view illustrations of a vertically adjustable substrate support and inwardly tapered skirt in accordance with an embodiment.
Figure 5B:
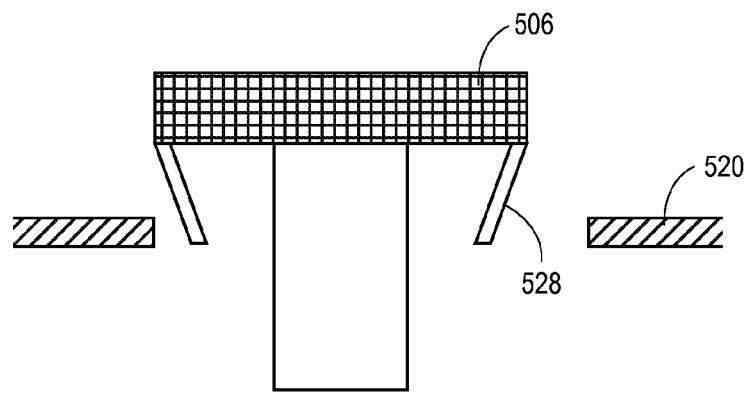

FIGS. 5A-5B are cross-sectional side view illustrations of another tunable portion which may be used independently or in conjunction with other embodiments of the invention. As shown, an inwardly tapered skirt 528 may be attached to a vertically positionable substrate support 506. FIG. 5A is an illustration of the vertically positionable substrate support 506 in a down position, and FIG. 5B is an illustration of the vertically positionable substrate support 506 in a raised position with respect to the gas flow equalizer plate 520. The amount of gas flowing through the primary gas flow paths 122A and 122B in FIG. 3 can be adjusted by changing the distance between the gas flow equalizer plate 520 and the inwardly tapered skirt 528.

In operation, embodiments of the present invention disclose a tunable gas flow equalizer for improving flow uniformity across a substrate in a processing chamber. In one embodiment, a method of controlling uniformity of gas flow across a substrate includes tuning the amount of gas flowing through primary gas flow paths 122A and 122B, and/or through gas bypass path 130A. A substrate may be loaded into a process chamber having a gas flow equalizer plate in a fixed position. The gas flow equalizer plate may have primary opening having a center point offset from the center point of a substrate support. The flow uniformity may be fine tuned either before or during the processing operation by adjusting a tuner configured with a secondary opening in the gas flow equalizer plate and/or by adjusting the height of a vertically positionable substrate support plate having an inwardly tapered skirt with respect to the gas flow equalizer plate. In accordance with embodiments, the tunable gas flow equalizer can broaden the window of operation of the apparatus.

In the foregoing specification, various embodiments of the invention have been described. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A gas flow equalizer plate comprising:
   a primary elliptical opening having a major axis and a minor axis; and
   a secondary opening having a center aligned with said major axis of said primary elliptical opening; and
   a tuner configured with said secondary opening to control bypass gas flow through the secondary opening and equalize primary gas flow through the primary opening surrounding a substrate support.

2. The gas flow equalizer plate of claim 1, wherein the primary elliptical opening has a larger area than the secondary opening.

3. The gas flow equalizer plate of claim 2, wherein an outer edge of said gas flow equalizer plate is configured to be uniformly attached to a lower liner of a processing chamber.

4. The gas flow equalizer plate of claim 2, wherein said major axis is approximately 19 inches and said minor axis is approximately 18 inches.

5. The gas flow equalizer plate of claim 2 formed from a non-conductive material.

6. The gas flow equalizer plate of claim 2 formed from a material selected form the group consisting of aluminum, quartz, and anodized aluminum.

7. The gas flow equalizer plate of claim 6 having a thickness of 2-10 mm.

8. The gas flow equalizer plate of claim 2, comprising an outer edge with an oblong shape.

9. The gas flow equalizer plate of claim 2, wherein the secondary opening is annular.

10. A process chamber comprising:
    a chamber body;
    a substrate support within said chamber body;
    an exhaust port; and
    a gas flow equalizer plate attached to said chamber body; wherein said gas flow equalizer plate includes a primary opening to surround said substrate support, a secondary opening, and a tuner configured with said secondary opening to control bypass gas flow through the secondary opening and equalize primary gas flow through the primary opening.

11. The process chamber of claim 10, wherein said primary opening is elliptical.

12. The process chamber of claim 11, wherein a center point of said substrate support is off-center from a center point of said primary elliptical opening.

13. The process chamber of claim 10, wherein said tuner comprises a flat plate having a width larger than a width of said secondary opening.

14. The process chamber of claim 10, wherein said tuner comprises a cylindrical plunger that is movable within said secondary opening.

15. The process chamber of claim 14, wherein said secondary opening has inwardly tapered walls.

16. The process chamber of claim 14, wherein said secondary opening has straight walls.

17. The process chamber of claim 10, wherein said gas flow equalizer plate is attached to a chamber liner of said chamber body.

18. The process chamber of claim 17, further comprising a plasma screen plate positioned above said gas flow equalizer plate.

19. The process chamber of claim 10, wherein said secondary opening is positioned directly over said exhaust port.

20. The process chamber of claim 10, wherein said substrate support is vertically positionable with regard to the gas flow equalizer plate, and said substrate support further comprises an inwardly tapered skirt.

\* \* \* \* \*